United States Patent
Nishikido

(10) Patent No.: US 6,933,777 B2
(45) Date of Patent: Aug. 23, 2005

(54) AM DETECTING APPARATUS WITH OVERMODULATION DETECTING FUNCTION

(75) Inventor: Osamu Nishikido, Tokyo (JP)

(73) Assignee: Renesas Technology Corp., Tokyo (JP)

(*) Notice: Subject to any disclaimer, the term of this patent is extended or adjusted under 35 U.S.C. 154(b) by 105 days.

(21) Appl. No.: 10/706,961

(22) Filed: Nov. 14, 2003

(65) Prior Publication Data

US 2004/0125891 A1 Jul. 1, 2004

(30) Foreign Application Priority Data

Dec. 26, 2002 (JP) ........................................ 2002-377868

(51) Int. Cl.$^7$ ............................. H03D 1/00; H03D 1/06; H04N 5/455
(52) U.S. Cl. ........................ 329/349; 329/350; 329/360; 348/726
(58) Field of Search ................................. 329/347, 349, 329/350, 358, 360; 348/726, 735; 360/29; 455/337

(56) References Cited

U.S. PATENT DOCUMENTS 6,803,815 B1 * 10/2004 Nishikido ................... 329/347

FOREIGN PATENT DOCUMENTS

| JP | 2000-031745 | 1/2000 |
|---|---|---|
| JP | 2001-333439 | 11/2001 |

* cited by examiner

*Primary Examiner*—David Mis
(74) *Attorney, Agent, or Firm*—Leydig, Voit & Mayer, Ltd.

(57) ABSTRACT

An AM detecting apparatus includes a voltage comparator And an AND circuit. The voltage comparator compares a detection signal a low-pass filter outputs with a no-signal potential. The AND circuit outputs, when the amplitude of an AM signal is higher than the reference value, one of a first control signal and second control signal in response to a comparison result of the voltage comparator 5, and outputs, when the amplitude of the AM signal is lower than the reference value, the first control signal. The phase of the VCO signal is controlled such that the phase difference between the AM signal and VCO signal agrees with the control signal the AND circuit outputs. The AM detecting apparatus can carry out the coherent detection of the desired signal in the AM signal even during overmodulation.

10 Claims, 9 Drawing Sheets

AM DETECTING APPARATUS WITH OVERMODULATION DETECTING FUNCTION

BACKGROUND OF THE INVENTION

1. Field of the Invention

The present invention relates to an AM (Amplitude Modulation) detecting apparatus that adjusts the phase of its voltage-controlled-oscillation signal (VCO signal) in such a manner that it maintains the phase difference between the amplitude modulation signal (AM signal) and VCO signal at a specified value.

2. Description of Related Art

A conventional AM detecting apparatus adjusts the phase of its VCO signal in such a manner that it maintains the phase difference between the AM signal and VCO signal at a specified difference, and outputs the VCO signal after the phase adjustment to a coherent detecting circuit.

In overmodulation in which the modulation factor of a video signal exceeds 100%, however, the phase of the AM signal is inverted, making it impossible to carryout the coherent detection of the video signal in the AM signal.

To curb the adverse effect of the phase inversion, the conventional AM detecting apparatus attenuates the AM signal in the overmodulation, and supplies the attenuated signal to the coherent detecting circuit (see, Relevant Reference 1).

Relevant Reference 1: Japanese patent application laid-open No. 2000-31745 (paragraphs [0027] to [0034], and FIG. 1), which is incorporated herein by reference.

With the foregoing configuration, the conventional AM detecting apparatus can mitigate the adverse effect caused by the phase inversion of the AM signal in the overmodulation. However, it has a problem of being unable to carry out the coherent detection of the video signal in the AM signal in the overmodulation.

SUMMARY OF THE INVENTION

The present invention is implemented to solve the foregoing problem. It is therefore an object of the present invention to provide an AM detecting apparatus capable of conducting the coherent detection of a desired signal in the AM signal in the overmodulation.

According to one aspect of the present invention, there is provided an AM detecting apparatus including: first comparator for comparing a detection signal of a coherent detection circuit with a no-signal potential; control means for outputting a first control signal or a second control signal in response to a comparison result of the first comparator when the amplitude of the AM signal is higher than a reference value, and for outputting the first control signal when the amplitude of the AM signal is lower than the reference value; and phase adjusting circuit for adjusting a phase of the VCO signal in such a manner that the phase difference between the AM signal and VCO signal is set at one of the first and second phase differences corresponding to the first and second control signals, wherein the VCO signal after the phase adjustment is supplied to the coherent detection circuit. Thus, it offers an advantage of being able to carry out the coherent detection of the desired signal in the AM signal even at overmodulation.

DETAILED DESCRIPTION OF THE PREFERRED EMBODIMENTS

The invention will now be described with reference to the accompanying drawings.

Embodiment 1

Figure 1:
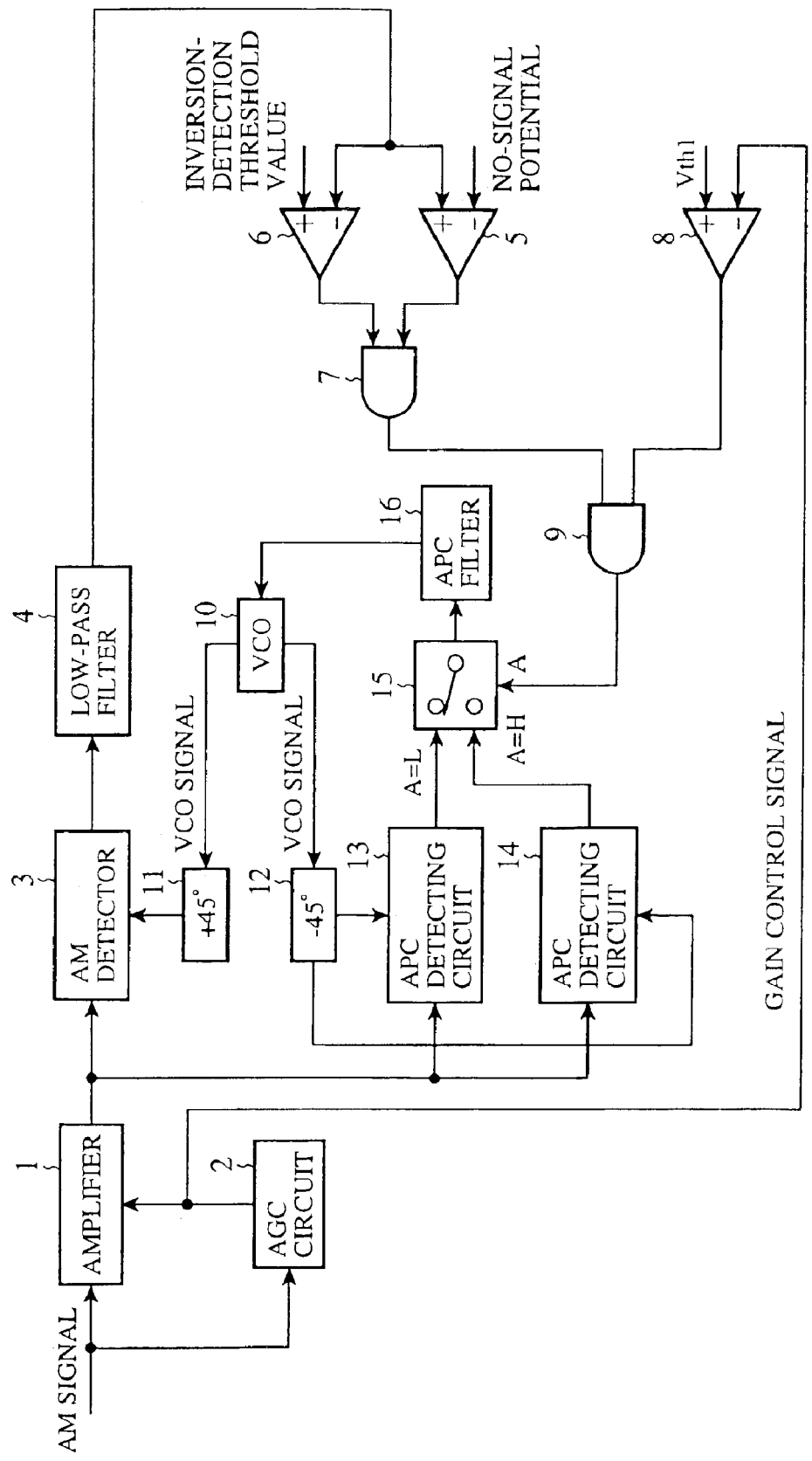
FIG. 1 is a block diagram showing a configuration of an embodiment 1 of an AM detecting apparatus in accordance with the present invention.

FIG. 1 is a block diagram showing a configuration of an embodiment 1 of the AM detecting apparatus in accordance with the present invention. In FIG. 1, an amplifier 1 amplifies an AM signal in such a manner that the average amplitude of the AM signal supplied to an AM detector 3 becomes substantially constant. An AGC circuit 2 increases or decreases the gain of the amplifier 1 in response to the reduction or increase of the amplitude of the AM signal.

The AM detector 3 carries out the coherent detection of a desired signal such as a video signal in the AM signal with reference to the VCO signal. For example, when the AM detector 3 conducts the negative AM detection, since the video signal is superimposed on the lower-side envelope of the AM signal, the AM detector 3 outputs the lower-side envelope of the AM signal as the detection signal. A low-pass filter 4 removes the second-order component from the detection signal of the AM detector 3. The AM detector 3 and low-pass filter 4 constitute a coherent detection circuit.

A voltage comparator 5 compares the detection signal, from which the second-order component is removed by the low-pass filter 4, with a no-signal potential. Thus, it outputs a low-level signal when the detection signal is lower than the no-signal potential, and a high-level signal when the detection signal is higher than the no-signal potential. A voltage comparator 6 compares the detection signal, from which the second-order component is removed by the low-pass filter 4, with an inversion-detection threshold value. It outputs a low-level signal when the detection signal is higher than the inversion-detection threshold value, and a high-level signal when the detection signal is lower than the inversion-detection threshold value.

An AND circuit 7 obtains the logical AND between the output signals of the voltage comparators 5 and 6. A voltage comparator 8 compares the gain control signal (AGC Filter Voltage) of the AGC circuit 2 fed to the amplifier 1 with a threshold voltage Vth1. It outputs a high-level signal when the gain control signal is lower than the threshold voltage Vth1, that is, when the amplitude of the AM signal is higher than the reference value. In contrast, it outputs a low-level signal when the gain control signal is higher than the threshold voltage Vth1, that is, when the amplitude of the AM signal is lower than the reference value. An AND circuit 9 obtains the logical AND between the output signal of the voltage comparator 8 and the output signal of the AND circuit 7, and outputs a low-level signal (first control signal) or high-level signal (second control signal) as its result. The voltage comparator 6, AND circuit 7, voltage comparator 8 and AND circuit 9 constitute a control means.

A voltage-controlled oscillator (called "VCO" from now on) 10 generates a VCO signal. A phase shifter 11 advances the phase of the VCO signal the VCO 10 generates by +45 degrees, and a phase shifter 12 delays the phase of the VCO signal the VCO 10 oscillates by −45 degrees. An APC detecting circuit 13 controls the oscillation of the VCO 10 such that it maintains the phase difference between the AM signal and the VCO signal the phase shifter 12 outputs at +90 degrees. An APC detecting circuit 14 controls the oscillation of the VCO 10 such that it maintains the phase difference between the AM signal and the VCO signal the phase shifter 12 outputs at −90 degrees. The transfer switch 15 connects the APC detecting circuit 13 to an APC filter 16 when it receives the low-level signal from the AND circuit 9, and connects the APC detecting circuit 14 to the APC filter 16 when it receives the high-level signal from the AND circuit 9. The APC filter 16 removes the noise from the control signal of the APC detecting circuit 13 or 14. The VCO 10, phase shifters 11 and 12, APC detecting circuits 13 and 14, transfer switch 15 and APC filter 16 constitute a phase adjusting circuit.

Next, the operation of the present embodiment 1 will be described.

First, the AGC circuit 2 controls the gain of the amplifier 1 in such a manner that it maintains the average amplitude of the AM signal supplied to the AM detector 3 at a constant value. Specifically, when the amplitude of the AM signal fed to the amplifier 1 reduces, it outputs a large gain control signal to increase the gain of the amplifier 1, and when the amplitude of the AM signal increases, it outputs a small gain control signal to reduce the gain of the amplifier 1.

However, when the amplitude of the AM signal fed to the amplifier 1 is very small, a desired amplitude may not be achieved even though the gain of the amplifier 1 is made maximum.

The AM detector 3, receiving the AM signal from the amplifier 1 and the VCO signal from the phase shifter 11, carries out the coherent detection of the desired signal such as the video signal in the AM signal with reference to the VCO signal.

For example, during the normal modulation in which the modulation factor of the video signal is within 100%, the transfer switch 15 selects the APC detecting circuit 13 as will be described later so that the phase difference between the VCO signal fed from the phase shifter 11 and the AM signal fed from the amplifier 1 is fixed at +180 degrees.

Figure 2:
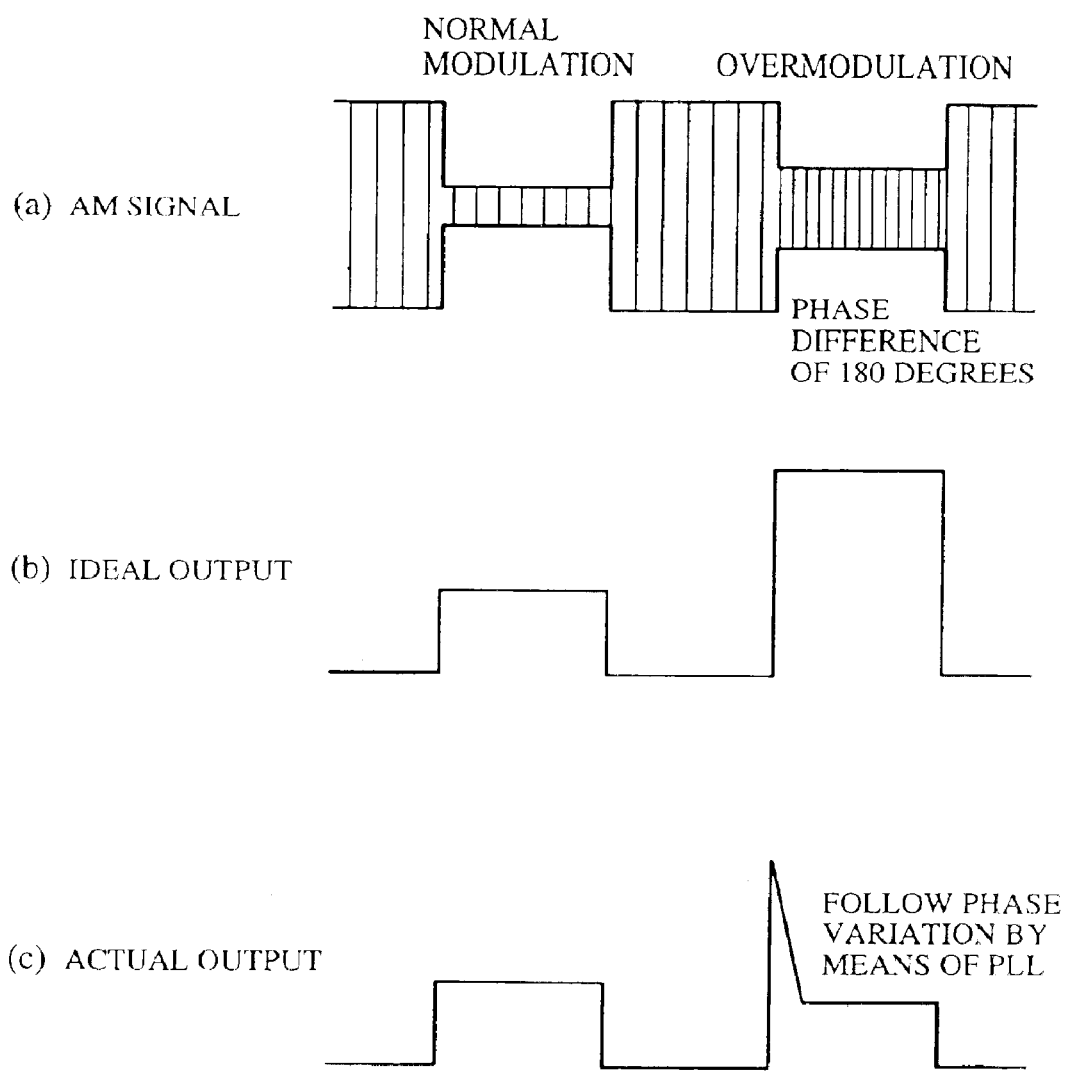
FIG. 2 is a diagram illustrating waveforms of the AM signal.
Figure 3:
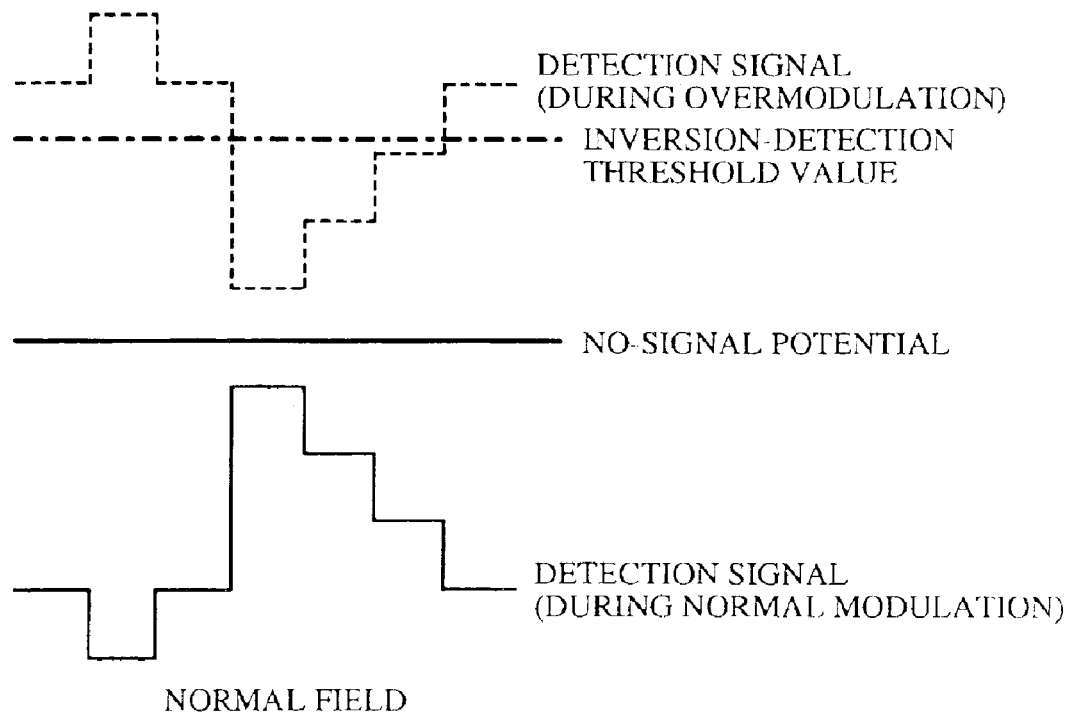
FIG. 3 is a diagram illustrating a relationship between the AM signal and a no-signal potential and inversion-detection threshold value.

Accordingly, the AM detector 3 outputs the lower-side envelope of the AM signal as its detection signal (see, FIGS. 2 and 3).

The low-pass filter 4 removes the second-order component from the detection signal of the AM detector 3, and supplies the detection signal to the voltage comparators 5 and 6.

Receiving the detection signal from which the second-order component is removed through the low-pass filter 4, the voltage comparator 5 compares the detection signal with the no-signal potential as illustrated in FIG. 3. In the normal modulation, the AM detector 3 detects the lower-side envelope of the AM signal as described above. Thus, the voltage comparator 5 outputs the low-level signal because the detection signal is lower than the no-signal potential.

Consequently, the AND circuit 9 supplies the switch 15 with the low-level signal (first control signal) regardless of the comparison result of the voltage comparators 6 and 8.

Thus, the switch 15 connects the APC detecting circuit 13 to the APC filter 16. In this case, the APC detecting circuit 13 controls the oscillation of the VCO 10 in such a manner that the phase difference between the AM signal the amplifier 1 outputs and the VCO signal the phase shifter 12 outputs is maintained at +90 degrees. Accordingly, as for the phase difference between the two input signals to the AM detector 3, the VCO signal fed from the phase shifter 11 and the AM signal fed from the amplifier 1, it is fixed at +180 degrees.

Next, in the overmodulation in which the modulation factor of the video signal exceeds 100%, the phase of the AM signal fed to the amplifier 1 is shifted 180 degrees as illustrated in FIG. 2, bringing about a temporary inversion of the output of the AM detector 3. In this case, if the APC detecting circuit 13 is connected with the APC filter 16, the output of the AM detector 3 is reinverted immediately so that it detects the lower-side envelope of the AM signal (see, actual output of FIG. 2(c)). However, since the phase of the AM signal is shifted 180 degrees, the video signal is superimposed on the upper-side envelope of the AM signal in the overmodulation. Thus, the AM detector 3 must detect the upper-side envelope of the AM signal.

The voltage comparator 5, receiving the detection signal from which the second-order component is removed through the low-pass filter 4, compares the detection signal with the no-signal potential as illustrated in FIG. 3. In the overmodulation, the voltage comparator 5 outputs the high-level signal because the AM detector 3 temporarily detects the upper-side envelope of the AM signal, and its detection signal becomes higher than the no-signal potential.

When the voltage comparator 5 outputs the high-level signal, the AND circuit 9 supplies the switch 15 with the high-level signal (second control signal) if the other two voltage comparators 6 and 8 output the high-level signal. The voltage comparator 8 outputs the high-level signal when the amplitude of the AM signal input to the amplifier 1 is higher than the reference value, that is, when the gain control signal of the AGC circuit 2 is lower than the threshold voltage Vth1. The voltage comparator 6 outputs the high-level signal when the detection signal from which the second-order component is removed through the low-pass filter 4 is lower than the inversion-detection threshold value.

In this case, the switch 15 connects the APC detecting circuit 14 to the APC filter 16 so that the APC detecting circuit 14 controls the oscillation of the VCO 10 in such a manner that it maintains the phase difference between the AM signal the amplifier 1 outputs and the VCO signal the phase shifter 12 outputs at −90 degrees. Consequently, as for the phase difference between the two input signals to the AM detector 3, the VCO signal fed from the phase shifter 11 and the AM signal fed from the amplifier 1, it is fixed at zero degree.

As a result, during the overmodulation, the AM detector 3 detects the upper-side envelope of the AM signal.

Thus, the APC detecting circuit 14 maintains the phase difference between its two input signals at −90 degrees so that the AM detector 3 detects the upper-side envelope of the AM signal. However, if the overmodulation is eliminated before starting the detection of upper-side envelope, and the normal modulation is recovered, the AM detection by the AM detector 3 becomes unstable. In such a case, it may happen that the AM detector 3 detects the upper-side envelope of the AM signal erroneously when it must detect the lower-side envelope of the AM signal.

In such a case, if the detection signal in which the second-order component is removed through the low-pass filter 4 is higher than the inversion-detection threshold value, the voltage comparator 6 outputs the low-level signal so that the AND circuit 9 supplies the switch 15 with the low-level signal (first control signal).

As a result, the switch 15 connects the APC detecting circuit 13 to the APC filter 16. The APC detecting circuit 13 controls the oscillation of the VCO 10 in such a manner that it maintains the phase difference between the AM signal the signal amplifier 1 outputs and the VCO signal the phase shifter 12 outputs at +90 degrees. Consequently, the phase difference between the two input signals to the AM detector 3, the VCO signal fed from the phase shifter 11 and the AM signal fed from the amplifier 1, is fixed at +180 degrees.

As a result, if the overmodulation is eliminated before the AM detector 3 starts the detection of the upper-side envelope of the AM signal, the AM detector 3 can detect the lower-side envelope of the AM signal correctly.

Figure 4:
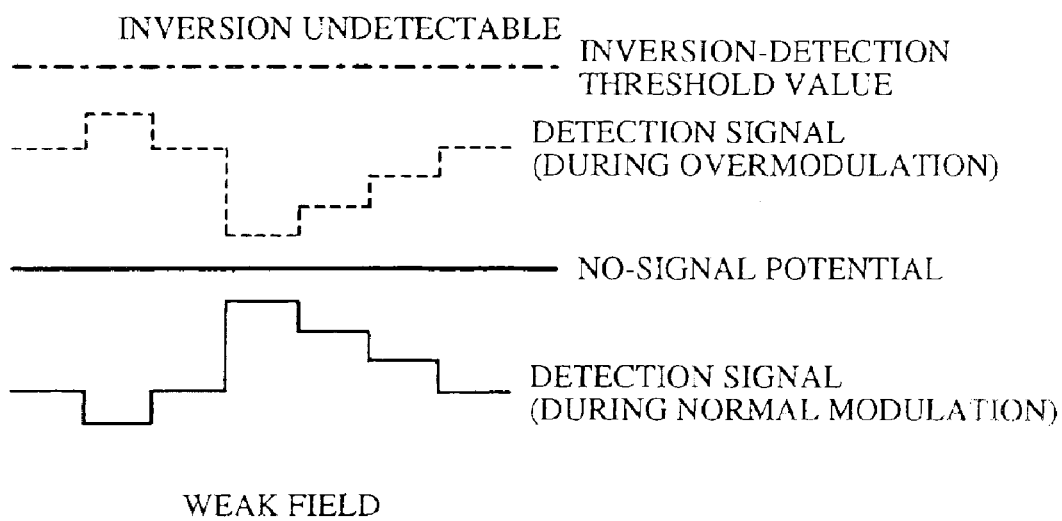
FIG. 4 is a diagram illustrating another relationship between the AM signal and a no-signal potential and inversion-detection threshold value.

However, when the amplitude of the AM signal input to the amplifier 1 is less than the reference value (in a weak field in which the desired amplitude is not achieved even if the gain of the amplifier 1 is made maximum), it sometimes occurs that the detection signal the low-pass filter 4 outputs does not exceed the inversion-detection threshold value as illustrated in FIG. 4, and hence the voltage comparator 6 continues to output the high-level signal.

In this case, the APC detecting circuit 13 is not selected by the output signal of the voltage comparator 6. In view of this, the present embodiment 1 selects the APC detecting circuit 13 using the output signal of the voltage comparator 8 in such a case.

More specifically, the voltage comparator 8, which compares the gain control signal fed from the AGC circuit 2 to the amplifier 1 with the threshold voltage Vth1, outputs the high-level signal when the gain control signal is lower than the threshold voltage Vth1, that is, when the amplitude of the AM signal is higher than the reference value. In contrast, it outputs the low-level signal in a weak field as illustrated in FIG. 4 or the like, in which the gain control signal is higher than the threshold voltage Vth1, that is, when the amplitude of the AM signal is lower than the reference value.

In response to the low-level signal., the switch 15 connects the APC detecting circuit 13 to the APC filter 16. The APC detecting circuit 13 controls the oscillation of the VCO 10 in such a manner that it maintains the phase difference between the AM signal the amplifier 1 outputs and the VCO signal the phase shifter 12 outputs at +90 degrees. Thus, as for the phase difference between the two input signals to the AM detector 3, the VCO signal fed from the phase shifter 11 and the AM signal fed from the amplifier 1, it is maintained at +180 degrees.

As a result, the AM detector 3 can detect the lower-side envelope of the AM signal even in the following conditions: The overmodulation is eliminated and the normal modulation is recovered before the AM detector 3 starts to detect the upper-side envelope of the AM signal; or the amplitude of the AM signal input to the amplifier 1 is less than the reference value, that is, the desired amplitude is not obtained even if the gain of the amplifier 1 is made maximum as in the weak field.

Next, when the overmodulation is eliminated and the normal modulation is restored while the AM detector 3 is detecting the upper-side envelope of the AM signal, the phase of the AM signal fed to the amplifier 1 returns to its previous state. In this case, although the output of the AM detector 3 is temporarily inverted, it is reinverted immediately if the APC detecting circuit 14 is connected to the APC filter 16, causing the AM detector 3 to detect the upper-side envelope of the AM signal. However, when the overmodulation is eliminated and the normal modulation is restored, the phase of the AM signal is returned to its previous state, and the video signal is superimposed on the lower-side envelope of the AM signal. Thus, the AM detector 3 must detect the lower-side envelope of the AM signal.

The voltage comparator 5, receiving the detection signal from which the second-order component is removed through the low-pass filter 4, compares the detection signal with the no-signal potential as illustrated in FIG. 3. When the normal modulation is recovered, the voltage comparator 5 outputs the low-level signal because the AM detector 3 temporarily detects the lower-side envelope of the AM signal, and hence the detection signal becomes lower than the no-signal potential.

Accordingly, the AND circuit 9 supplies the switch 15 with the low-level signal (first control signal) regardless of the comparison result of the voltage comparators 6 and 8.

Thus, the switch 15 connects the APC detecting circuit 13 to the APC filter 16. The APC detecting circuit 13 controls the oscillation of the VCO 10 in such a manner that it maintains the phase difference between the AM signal the amplifier 1 outputs and the VCO signal the phase shifter 12 outputs at +90 degrees. Thus, the phase difference between the VCO signal and the AM signal the AM detector 3 receives from the phase shifter 11 and the amplifier 1 is fixed at +180 degrees.

As a result, when the normal modulation is restored, the AM detector 3 starts to detect the lower-side envelope of the AM signal.

As described above, the present embodiment 1 is configured such that it includes the voltage comparator 5 for comparing the detection signal the low-pass filter 4 outputs with the no-signal potential; and the AND circuit 9 for outputting the first control signal or second control signal in response to the comparison result of the voltage comparator 5 when the amplitude of the AM signal is higher than the reference value, and for outputting the first control signal when the amplitude of the AM signal is lower than the reference value, and that it adjusts the phase of the VCO signal in such a manner that the phase difference between the AM signal and VCO signal is matched to one of the first and second phase differences corresponding to the first and second control signals the AND circuit 9 outputs. As a result, it offers an advantage of being able to carry out the coherent detection of the desired signal from the AM signal even during the overmodulation.

In addition, the present embodiment 1 is configured such that when the amplitude of the AM signal is higher than the reference value, the AND circuit 9 outputs the first control signal as long as the detection signal the low-pass filter 4 outputs is lower than the no-signal potential, and outputs the second control signal when the detection signal exceeds the no-signal potential. Thus, it offers an advantage of being able to positively detect the occurrence of the overmodulation.

Furthermore, the present embodiment 1 is configured such that it compares the detection signal the low-pass filter 4 outputs with the no-signal potential and with the inversion-detection threshold value. Thus, it offers an advantage of being able to detect even in the unstable condition of the AM detection that the AM detector 3 detects the upper-side envelope of the AM signal erroneously when it must detect the lower-side envelope of the AM signal.

Moreover, the present embodiment 1 is configured such that when the amplitude of the AM signal is higher than the reference value, it outputs the first control signal when the detection signal the low-pass filter 4 outputs is lower than the no-signal potential or the detection signal is higher than the inversion-detection threshold value, and it outputs the second control signal when the detection signal is higher than the no-signal potential and the detection signal is lower than the inversion-detection threshold value. Thus, it offers an advantage of being able to detect that the overmodulation is eliminated and the normal modulation is restored, without using a complicated configuration.

Finally, the present embodiment 1 is configured such that it compares the gain control signal of the AGC circuit 2 with the threshold voltage Vth1 to make a decision as to whether the amplitude of the AM signal is greater than the reference value or not. Thus, it offers an advantage of being able to make a decision as to whether the amplitude of the AM signal is greater than the reference value or not accurately without employing a complicated configuration.

Embodiment 2

Figure 5:
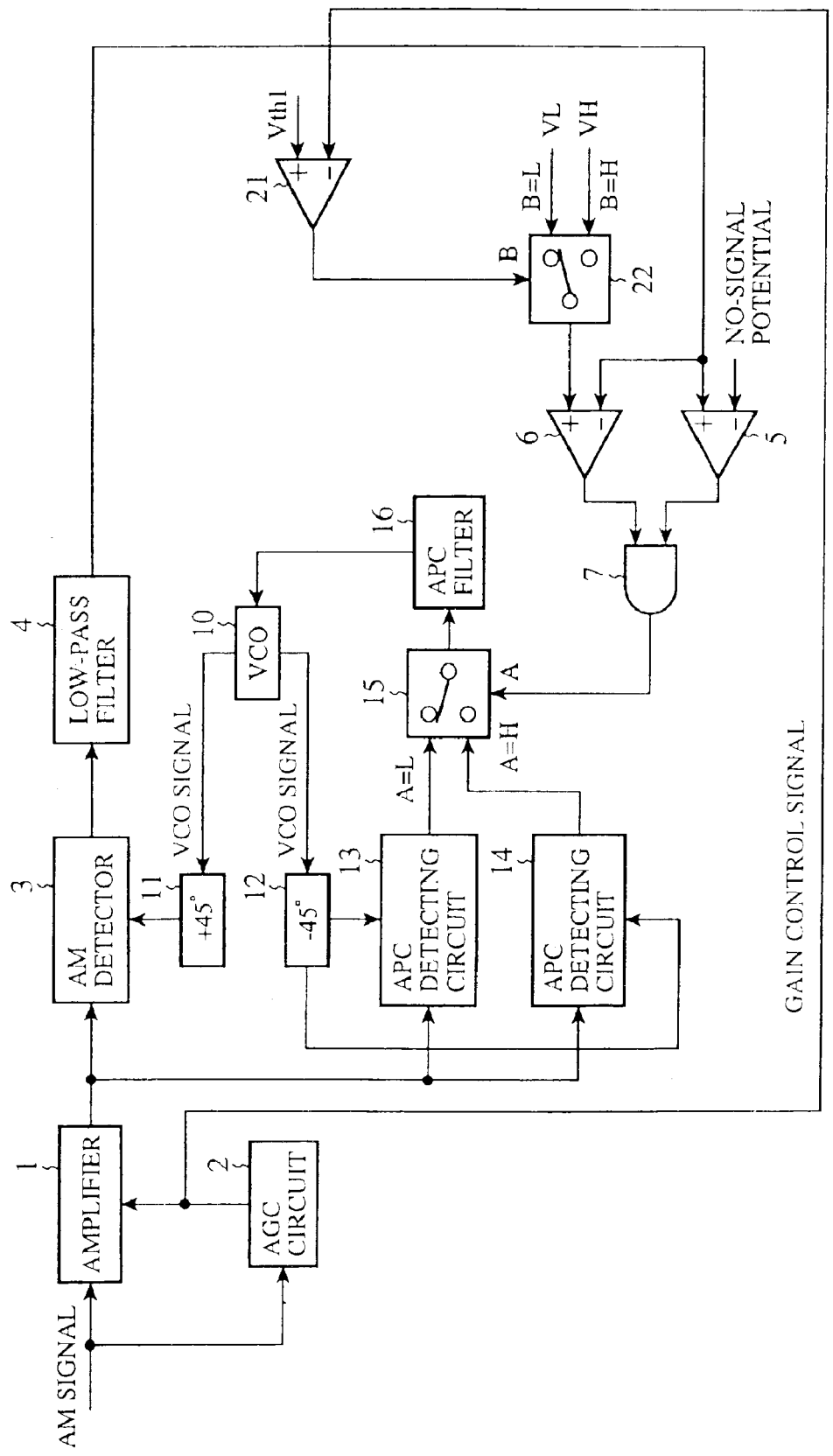
FIG. 5 is a block diagram showing a configuration of an embodiment 2 of the AM detecting apparatus in accordance with the present invention.

FIG. 5 is a block diagram showing a configuration of an embodiment 2 of the AM detecting apparatus in accordance with the present invention. In FIG. 5, the same reference numerals as those of FIG. 1 designate the same or like portions, and the description thereof is omitted here.

A voltage comparator 21 compares the gain control signal of the AGC circuit 2, which is supplied to the amplifier 1, with the threshold voltage Vth1. It outputs the high-level signal when the gain control signal is lower than the threshold voltage Vth1, that is, when the amplitude of the AM signal is higher than the reference value. In contrast, it outputs the low-level signal when the gain control signal is higher than the threshold voltage Vth1, that is, when the amplitude of the AM signal is lower than the reference value. Receiving the high-level signal from the voltage comparator 21, a selecting switch 22 selects the inversion-detection threshold value VH. In contrast, receiving the low-level signal from the voltage comparator 21, it selects the inversion-detection threshold value VL lower than the inversion-detection threshold value VH. The voltage comparator 21 and selecting switch 22 constitute a selecting switch.

In the foregoing embodiment 1, when the gain control signal of the AGC circuit 2 is higher than the threshold voltage Vth1, the transfer switch 15 selects the APC detecting circuit 13. In this case, it cannot select the APC detecting circuit 14 even if the overmodulation takes place in the weak field.

In view of this, the present embodiment 2 makes it possible to select the APC detecting circuit 14 during the overmodulation even in the weak field.

More specifically, the voltage comparator 21 compares the gain control signal of the AGC circuit 2, which is supplied to the amplifier 1, with the threshold voltage Vth1, and outputs the high-level signal when the gain control signal is lower than the threshold voltage Vth1, that is, when the amplitude of the AM signal is greater than the reference value.

Thus, the selecting switch 22 selects the higher inversion-detection threshold value VH, and supplies it to the voltage comparator 6.

In contrast, when the gain control signal is higher than the threshold voltage Vth1, that is, when the amplitude of the AM signal is lower than the reference value, it outputs the low-level signal.

Thus, the selecting switch 22 selects the lower inversion-detection threshold value VL, and supplies it to the voltage comparator 6.

As a result, when the amplitude of the AM signal is higher than the reference value, the voltage comparator 6 compares the detection signal with the higher inversion-detection threshold value VH. In contrast, when the amplitude of the AM signal is lower than the reference value, that is, in the case of the weak field, the voltage comparator 6 compares the detection signal with the lower inversion-detection threshold value VL. As a result, the present embodiment makes it possible to select the APC detecting circuit 14 during the overmodulation even in the weak field.

Embodiment 3

Figure 6:
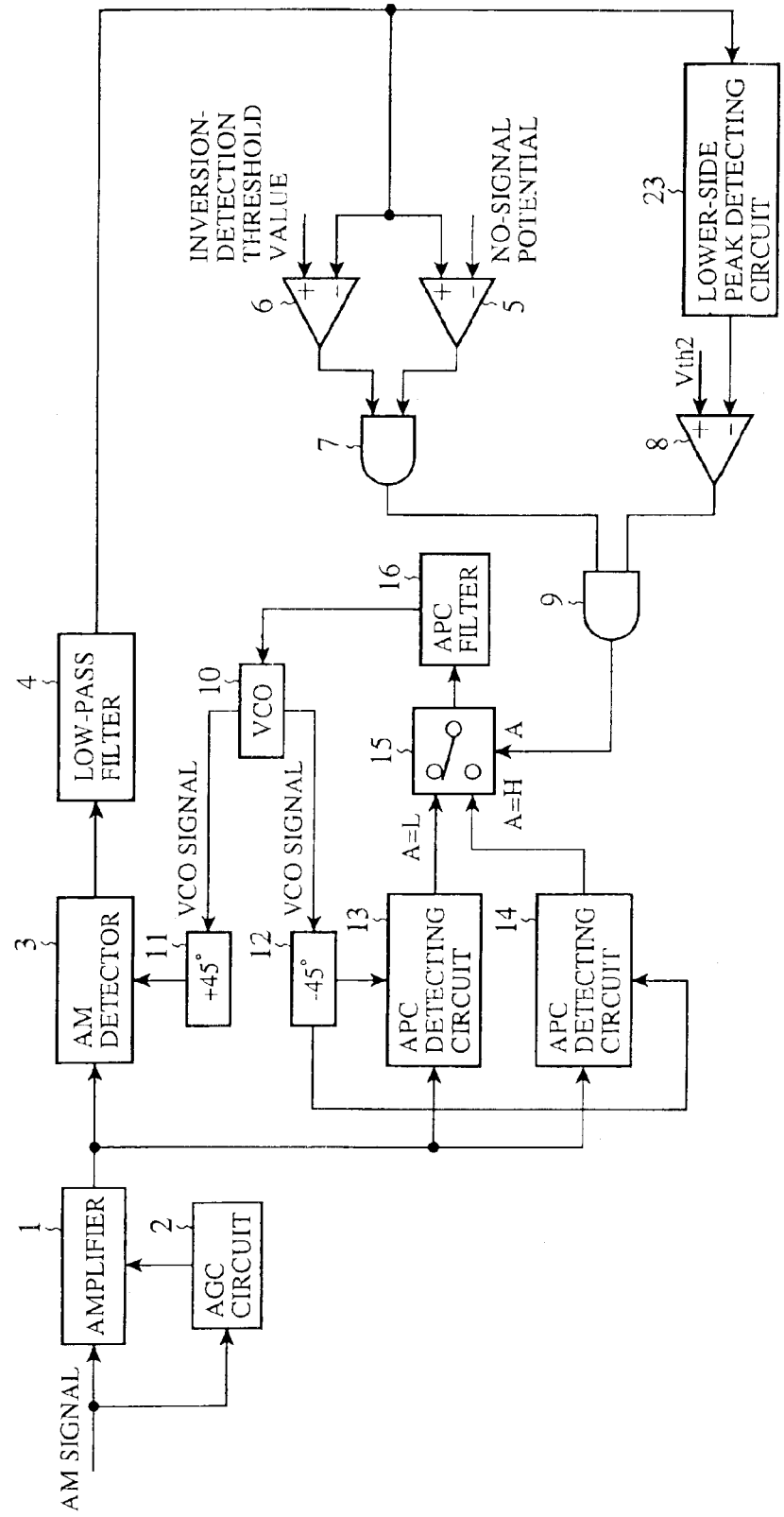
FIG. 6 is a block diagram showing a configuration of an embodiment 3 of the AM detecting apparatus in accordance with the present invention.

FIG. 6 is a block diagram showing a configuration of an embodiment 3 of the AM detecting apparatus in accordance with the present invention. In FIG. 6, the same reference numerals as those of FIG. 1 designate the same or like portions, and the description thereof is omitted here.

A lower-side peak detecting circuit 23 detects a lower-side peak value of the detection signal the low-pass filter 4 outputs, and supplies it to the voltage comparator 8. The lower-side peak detecting circuit 23, the voltage comparators 6 and 8, and the AND circuits 7 and 9 constitute control means.

In the foregoing embodiment 1, the voltage comparator 8 compares the gain control signal of the AGC circuit 2, which is supplied to the amplifier 1, with the threshold voltage Vth1 to decide as to whether the amplitude of the AM signal is higher than the reference value or not. However, the configuration of FIG. 6 is also possible in which the lower-side peak detecting circuit 23 detects the lower-side peak value of the detection signal, and the voltage comparator 8 compares the lower-side peak value with a threshold voltage Vth2 to decides as to whether the amplitude of the AM signal is higher than the reference value. It makes a decision that the amplitude of the AM signal is smaller than the reference value when the absolute value of the lower-side peak value is smaller than the absolute value of the threshold voltage Vth2.

Here, the threshold voltage Vth2 must be set at a value slightly higher than a normal lower-side peak value.

The present embodiment 3 has the same advantage as that of the foregoing embodiment 1. Moreover, it offers an advantage of being able to improve the overmodulation characteristics in the weak field more quickly than the foregoing embodiment 1. This is because it is free from the influence of the delay due to the gain control of the AGC circuit 2 because the voltage comparator 8 receives the lower-side peak value instead of the gain control signal of the AGC circuit 2.

Embodiment 4

Figure 7:
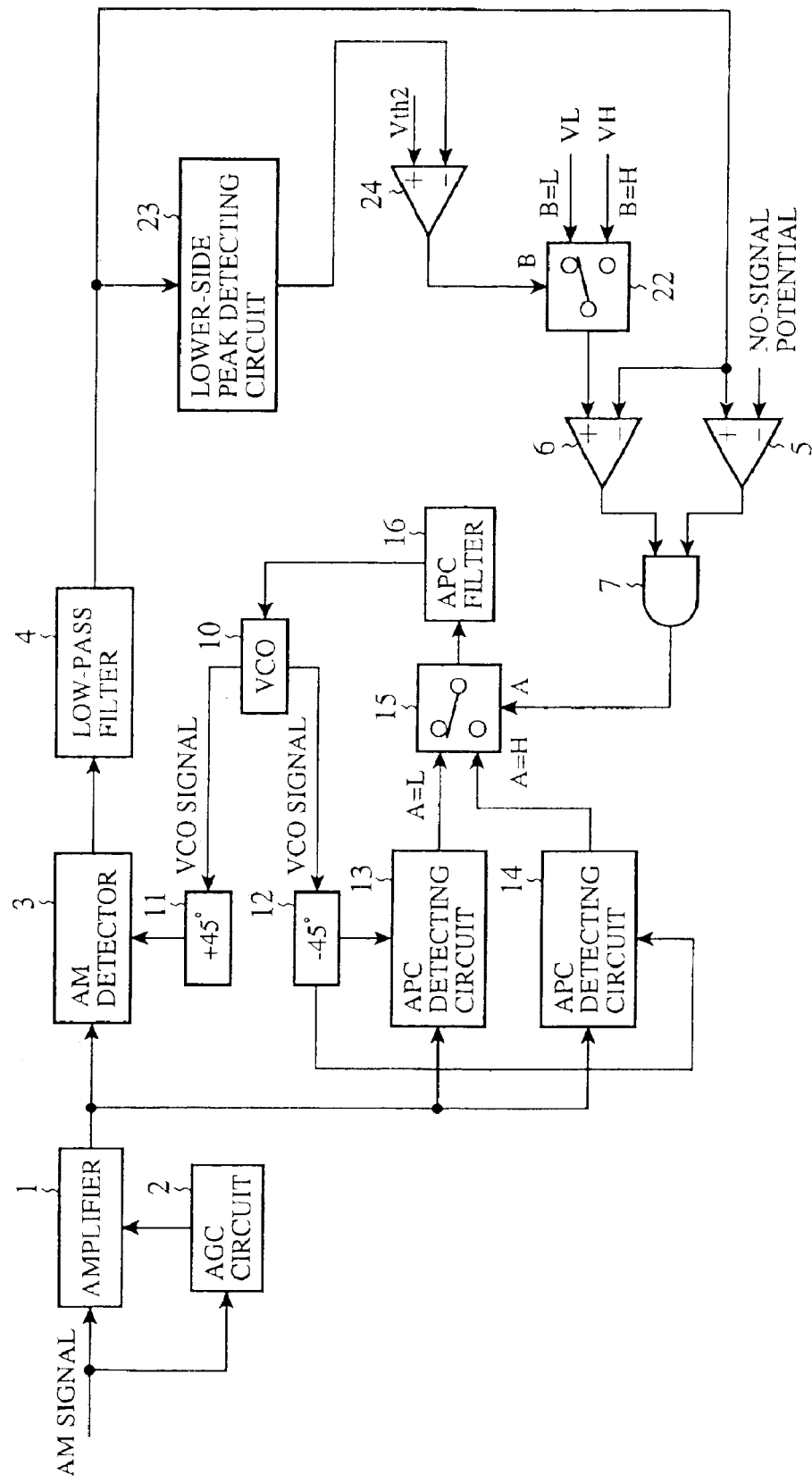
FIG. 7 is a block diagram showing a configuration of an embodiment 4 of the AM detecting apparatus in accordance with the present invention.

FIG. 7 is a block diagram showing a configuration of an embodiment 4 of the AM detecting apparatus in accordance with the present invention. In FIG. 7, the same reference numerals as those of FIGS. 5 and 6 designate the same or like portions, and the description thereof is omitted here.

A voltage comparator 24 compares the absolute value of the lower-side peak value of the detection signal the lower-side peak detecting circuit 23 outputs with the absolute value of the threshold voltage Vth2. It outputs the high-level signal when the absolute value of the lower-side peak value is higher than the absolute value of the threshold voltage Vth2, that is, when the amplitude of the AM signal is higher than the reference value. In contrast, it outputs the low-level signal when the lower-side peak value is lower than the threshold voltage Vth2, that is, when the amplitude of the AM signal is lower than the reference value. The voltage comparator 24 constitutes the selecting switch.

In the foregoing embodiment 2, the voltage comparator 21 compares the gain control signal of the AGC circuit 2, which is supplied to the amplifier 1, with the threshold voltage Vth1. However, a configuration is also possible in which the voltage comparator 24 compares the lower-side peak value of the detection signal the lower-side peak detecting circuit 23 outputs with the threshold voltage Vth2, outputs the high-level signal when the absolute value of the lower-side peak value is higher than the absolute value of the threshold voltage Vth2, and outputs the low-level signal when the absolute value of the lower-side peak value is lower than the absolute value of the threshold voltage Vth2. The configuration has the same advantage as that of the foregoing embodiment 2.

Embodiment 5

Figure 8:
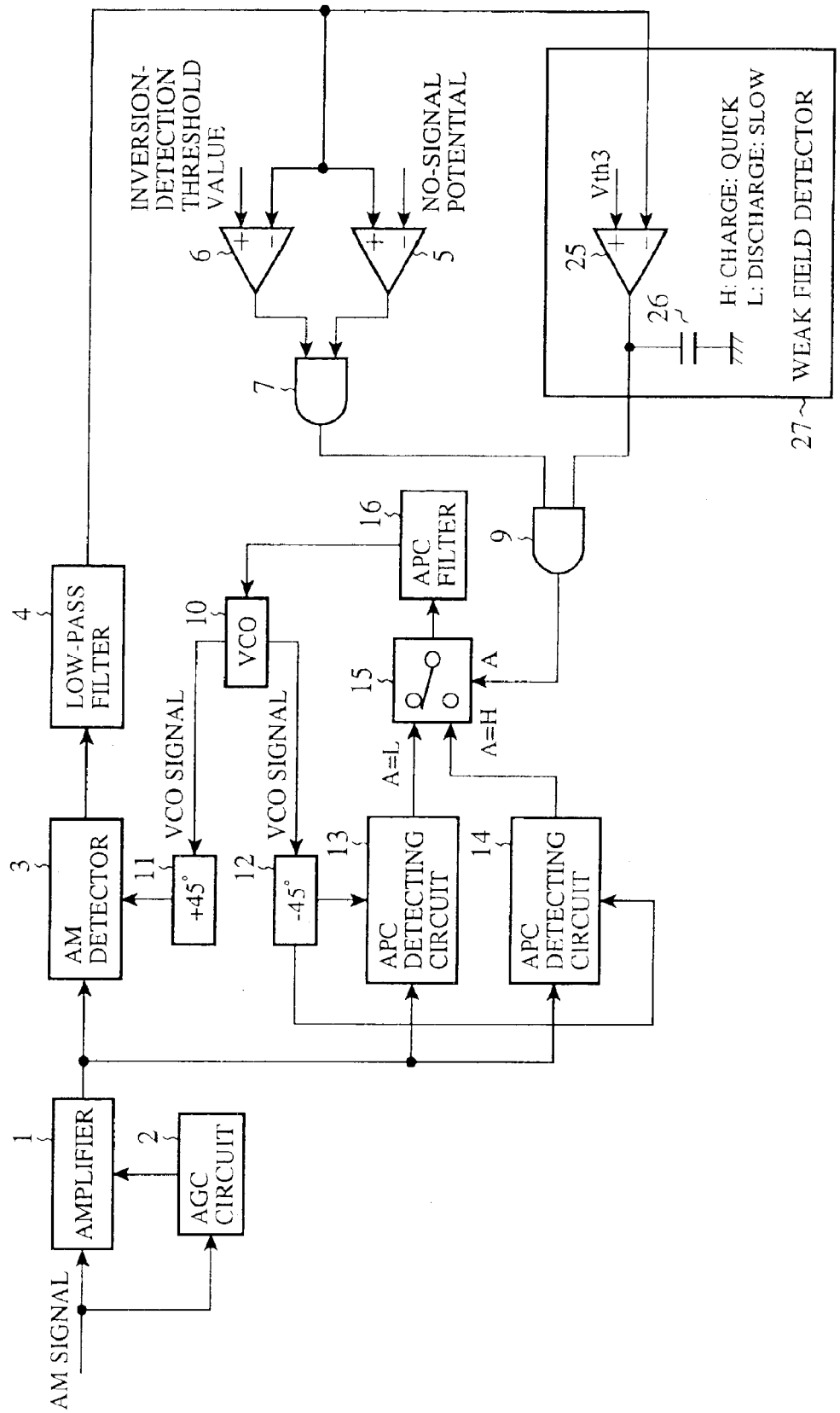
FIG. 8 is a block diagram showing a configuration of an embodiment 5 of the AM detecting apparatus in accordance with the present invention.

FIG. 8 is a block diagram showing a configuration of an embodiment 5 of the AM detecting apparatus in accordance with the present invention. In FIG. 8, the same reference numerals as those of FIG. 6 designate the same or like portions, and the description thereof is omitted here.

A voltage comparator 25 and a capacitor 26 constitute a weak field detector 27 for making a decision as to whether the amplitude of the AM signal is higher than the reference value or not. The voltage comparator 25 compares the detection signal the low-pass filter 4 outputs with a threshold voltage Vth3. The weak field detector 27, the voltage comparator 6, and the AND circuits 7 and 9 constitute the control means.

In the foregoing; embodiment 3, the voltage comparator 8 compares the lower-side peak value of the detection signal with the threshold voltage Vth2 to decide as to whether the amplitude of the AM signal is higher than the reference value or not. However, a configuration is also possible in which the weak field detector 27 consisting of the voltage comparator 25 and capacitor 26 makes a decision as to whether the amplitude of the AM signal is higher than the reference value or not, offering the same advantage as that of the foregoing embodiment 3.

More specifically, the weak field detector 27 is a circuit conventionally used as a speed-up AGC, and the voltage comparator 25 is special in that it causes a large current to flow when the input to the non-inverting terminal (threshold voltage Vth3) is higher than the input to the inverting terminal (detection signal), and pulls a small current when the input to non-inverting terminal is lower than the input to the inverting terminal.

Accordingly, when the absolute value of the detection signal remains smaller than the absolute value of the threshold voltage Vth3 for a while, the capacitor 26 discharges gradually, and the output of the weak field detector 27 becomes low level.

In contrast, when the absolute value of the detection signal becomes higher than the absolute value of the threshold voltage Vth3, the capacitor 26 is charged quickly so that the weak field detector 27 outputs a high-level signal.

Thus, the present embodiment 5 has the same advantage as the foregoing embodiment 3. However, it differs from the foregoing embodiment 3 in that even if the lower-side peak value of the detection signal drops because of noise, the output of the weak field detector 27 remains high level unless the detection signal continues the low level for a while. Therefore it offers an advantage of being able to improve the noise immunity.

Embodiment 6

Figure 9:
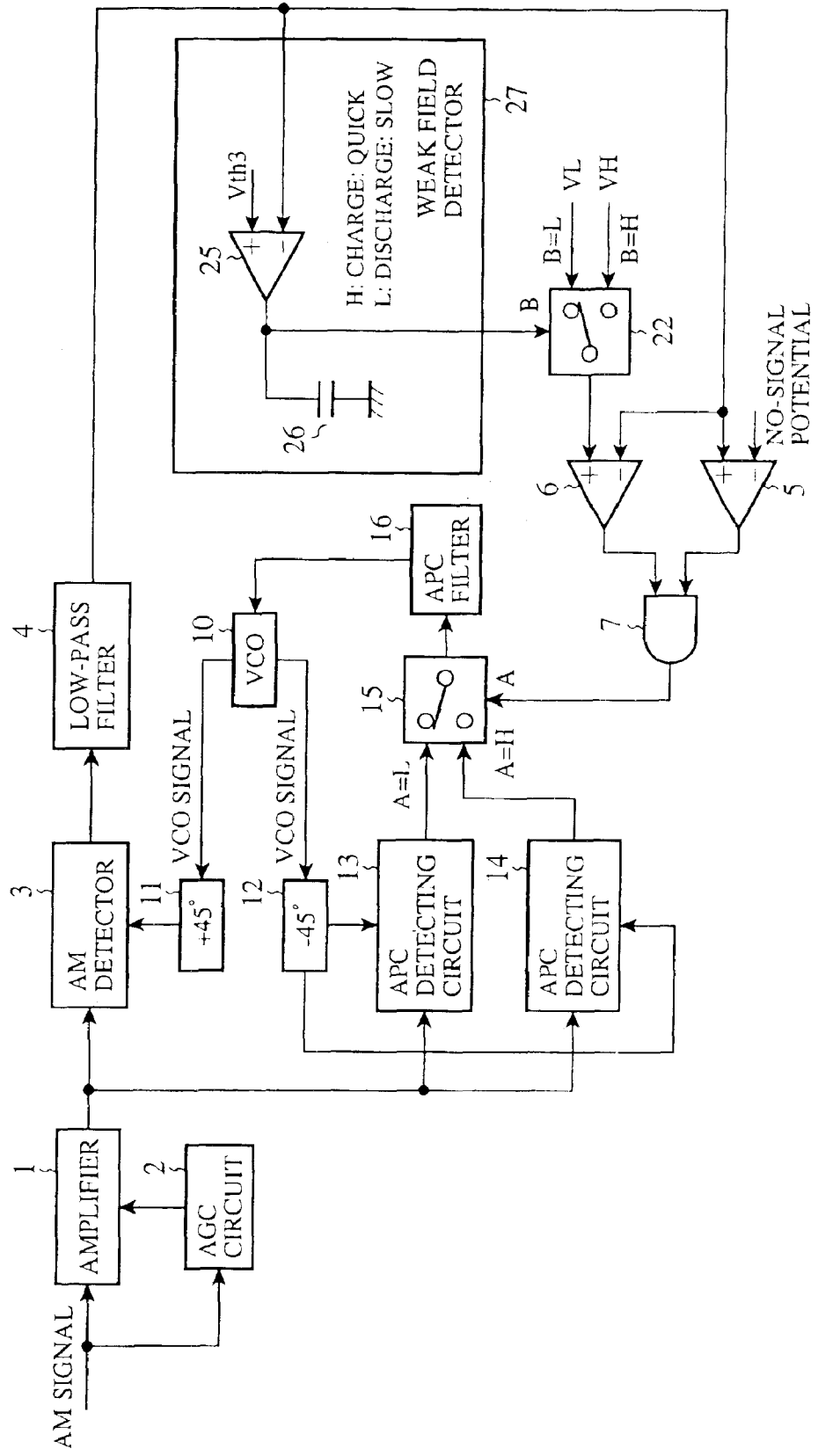
FIG. 9 is a block diagram showing a configuration of an embodiment 6 of the AM detecting apparatus in accordance with the present invention.

Although the voltage comparator 21 compares the gain control signal of the AGC circuit 2, which is supplied to the amplifier 1, with the threshold voltage Vth1 in the foregoing embodiment 2, this is not essential. For example, a configuration as shown in FIG. 9 is also possible. In the configuration, when the absolute value of the detection signal the low-pass filter 4 outputs remains lower than the absolute value of the threshold voltage Vth3 for awhile, the weak field detector 27 supplies the low-level signal to the selecting switch 22, and when the absolute value of the detection signal becomes higher than the absolute value of the threshold voltage Vth3, the weak field detector 27 supplies a high-level signal to the selecting switch 22. The configuration has the same advantage as that of the foregoing embodiment 2.

Embodiment 7

Figure 10:
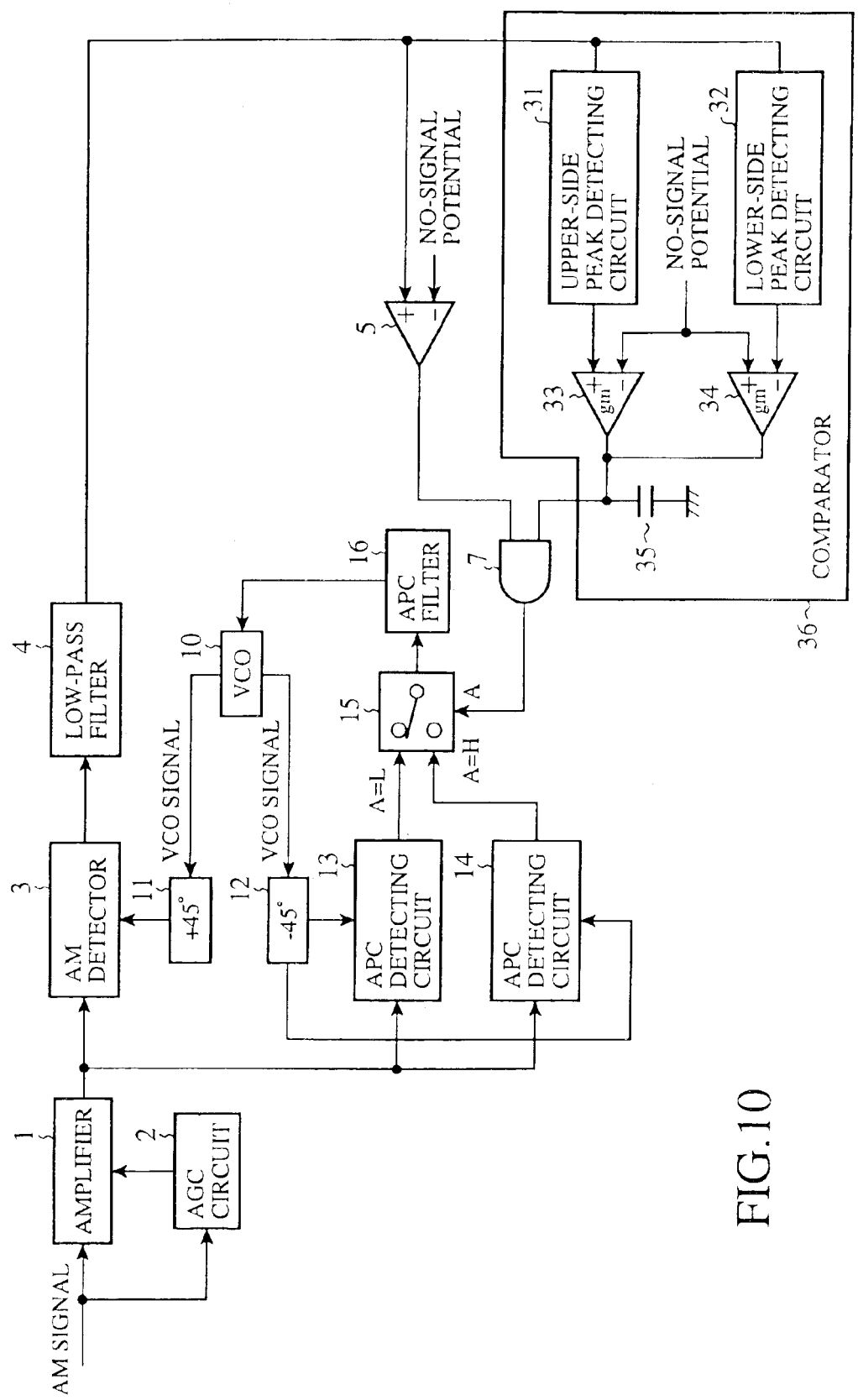
FIG. 10 is a block diagram showing a configuration of an embodiment 7 of the AM detecting apparatus in accordance with the present invention.

FIG. 10 is a block diagram showing a configuration of an embodiment 7 of the AM detecting apparatus in accordance with the present invention. In FIG. 10, the same reference numerals as those of FIG. 1 designate the same or like portions, and the description thereof is omitted here.

An upper-side peak detecting circuit 31 detects an upper-side peak value of the detection signal the low-pass filter 4 outputs, and a lower-side peak detecting circuit 32 detects a lower-side peak value of the detection signal.

A gm amplifier 33 outputs a current corresponding to the difference between the upper-side peak value the upper-side peak detecting circuit 31 detects and the no-signal potential. A gm amplifier 34, which has the same capacity as the gm amplifier 33, and outputs a current corresponding to the difference between the lower-side peak value the lower-side peak detecting circuit 32 detects and the no-signal potential.

The upper-side peak detecting circuit 31, lower-side peak detecting circuit 32, gm amplifiers 33 and 34 and capacitor 35 constitute a comparator (second comparator) 36.

The present embodiment 7 detects the overmodulation by having the voltage comparator 5 compare the detection signal with the no-signal potential as in the foregoing embodiment 1. However, the phenomenon of the temporary inversion of the output of the AM detector 3, which occurs when the overmodulation is eliminated and the normal modulation is restored, is detected as follows.

First, the upper-side peak detecting circuit 31 detects the upper-side peak value of the detection signal the low-pass filter 4 outputs, and the lower-side peak detecting circuit 32 detects the lower-side peak value of the detection signal the low-pass filter 4 outputs.

Subsequently, when the overmodulation is being detected and the APC detecting circuit 14 is selected, and unless the output of the AM detector 3 is inverted, the difference between the lower-side peak value and no-signal potential is greater than the difference between the upper-side peak value and no-signal potential. Accordingly, the gm amplifier 34 continues to charge the capacitor 35. Thus, the comparator 36 outputs the high-level signal, thereby continuing the selection of the APC detecting circuit 14.

In contrast, when the output of the AM detector 3 is inverted, the difference between the upper-side peak value and no-signal potential is greater than the difference between the lower-side peak value and no-signal potential. Thus, the capacitor 35 continues to discharge, and the comparator 36 outputs the low-level signal to select the APC detecting circuit 13, and the inversion of the output of the AM detector 3 is released.

As described above, the present embodiment 7 is configured such that it includes the voltage comparator 5 for comparing the detection signal the low-pass filter 4 outputs with the no-signal potential; the comparator 36 for detecting the upper-side peak value and lower-side peak value of the detection signal, and for comparing the difference between the upper-side peak value and no-signal potential with the difference between the lower-side peak value and no-signal potential; and the AND circuit 7 for outputting the first control signal or second control signal in response to the comparison result of the voltage comparator 5 and comparator 36. Therefore the present embodiment 7 offers an advantage of being able to carry out the coherent detection of the desired signal in the AM signal even during the overmodulation.

In addition, the present embodiment 7 offers an advantage of being able to release the inversion of the output of the AM detector 3 even in the weak field without using the voltage comparator 8 for making a decision as to whether the amplitude of the AM signal is higher than the reference value as in the foregoing embodiment 1.

What is claimed is:

1. An AM (Amplitude Modulation) detecting apparatus comprising:
    a coherent detection circuit for carrying out coherent detection of a desired signal in an AM signal with reference to a VCO (voltage-controlled-oscillation) signal to generate a detection signal;
    a first comparator for comparing the detection signal with a no-signal potential;
    control means for outputting one of a first control signal and a second control signal in a first state, and for outputting the first control signal in a second state; and
    a phase adjusting circuit for adjusting a phase of the VCO signal in such a manner that a phase difference between the AM signal and VCO signal is set at one of first and second phase differences corresponding to the first and second control signals.

2. The AM detecting apparatus according to claim 1, wherein the first state is a state in which the amplitude of the AM signal is higher than a reference value, and the second state is a state in which the amplitude of the AM signal is lower than the reference value.

3. The AM detecting apparatus according to claim 2, wherein said control means outputs, while the amplitude of the AM signal is higher than the reference value, the first control signal when the detection signal is lower than the no-signal potential, and the second control signal when the detection signal is higher than the no-signal potential.

4. The AM detecting apparatus according to claim 3, wherein said control means includes a second comparator for comparing the detection signal with an inversion-detection threshold, and wherein said control means outputs, while the amplitude of the AM signal is higher than the reference value, the first control signal when the detection signal is lower than the no-signal potential or the detection signal is higher than the inversion-detection threshold value, and the second control signal when the detection signal is higher than the no-signal potential and lower than the inversion-detection threshold value.

5. The AM detecting apparatus according to claim 2, wherein said control means compares again control signal of an AGC circuit, which controls again of an amplifier for amplifying the AM signal, with a predetermined threshold value, and makes a decision as to whether the amplitude of the AM signal is higher than the reference value.

6. The AM detecting apparatus according to claim 2, wherein said control means makes a decision as to whether the amplitude of the AM signal is higher than the reference value by comparing a lower-side peak value of the detection signal with a predetermined threshold value.

7. The AM detecting apparatus according to claim 2, wherein said control means makes a decision as to whether the amplitude of the AM signal is higher than the reference value by comparing the detection signal with a predetermined threshold value.

8. The AM detecting apparatus according to claim 7, wherein said control means comprises a weak field detector including a voltage comparator and a capacitor, and wherein said weak field detector compares the detection signal with the predetermined threshold value.

9. The AM detecting apparatus according to claim 1, wherein said control means comprises a selecting switch for selecting an inversion-detection threshold value in response to an amplitude of the AM signal; and a second comparator for comparing the detection signal with the inversion-detection threshold value selected by said selecting switch, and wherein said control means outputs one of the first and second control signals in response to a comparison result of said second comparator.

10. The AM detecting apparatus according to claim 1, wherein said control means comprises a second comparator for detecting an upper-side peak value and a lower-side peak value of the detection signal, and for comparing a difference between the upper-side peak value and the no-signal potential with a difference between the lower-side peak value and the no-signal potential, and wherein said control means outputs one of the first and control signals in response to comparison results of said first and second comparators.

* * * * *